United States Patent
Srinivasan et al.

(10) Patent No.: US 7,548,738 B2
(45) Date of Patent: Jun. 16, 2009

(54) PEAK DETECTOR

(75) Inventors: Vishnu S. Srinivasan, Austin, TX (US);
G. Tyson Tuttle, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 427 days.

(21) Appl. No.: 11/172,477

(22) Filed: Jun. 30, 2005

(65) Prior Publication Data

US 2007/0004359 A1    Jan. 4, 2007

(51) Int. Cl.
H04B 7/00    (2006.01)
H04B 17/00    (2006.01)

(52) U.S. Cl. .............. 455/232.1; 455/67.11; 455/234.1; 455/250.1

(58) Field of Classification Search ................. 455/63.1, 455/67.13, 114.2, 296, 67.11, 232.1, 234.1, 455/250.1, 245.1
See application file for complete search history.

(56) References Cited

U.S. PATENT DOCUMENTS

| | | | | |
|---|---|---|---|---|
| 3,895,237 A | * | 7/1975 | Harr | 327/62 |
| 3,973,197 A | * | 8/1976 | Meyer | 324/103 P |
| 4,029,904 A | * | 6/1977 | Papeschi | 375/318 |
| 4,216,502 A | * | 8/1980 | Fox | 348/682 |
| 4,777,629 A | * | 10/1988 | Morris et al. | 367/69 |
| 5,706,222 A | * | 1/1998 | Bonaccio et al. | 708/841 |
| 6,208,173 B1 | * | 3/2001 | Redman-White | 327/59 |
| 6,545,537 B2 | * | 4/2003 | Ohashi et al. | 330/254 |
| 6,762,627 B1 | * | 7/2004 | Gater | 327/58 |
| 6,836,156 B2 | * | 12/2004 | Chien | 327/58 |
| 6,977,531 B2 | * | 12/2005 | Chien | 327/62 |
| 7,013,117 B2 | * | 3/2006 | Darabi | 455/240.1 |
| 7,167,692 B2 | * | 1/2007 | Khorram | 455/115.3 |
| 7,180,335 B2 | * | 2/2007 | Hill | 327/58 |
| 7,266,163 B2 | * | 9/2007 | Khorram et al. | 375/334 |

* cited by examiner

Primary Examiner—Sonny Trinh
(74) Attorney, Agent, or Firm—Trop, Pruner & Hu, P.C.

(57) ABSTRACT

A receiver includes a gain stage, a peak detector and a processor. The gain stage provides an output signal, and the peak detector provides a binary indication of whether the output signal has reached a predetermined threshold. The processor controls the gain stage in response to the binary indication.

17 Claims, 9 Drawing Sheets

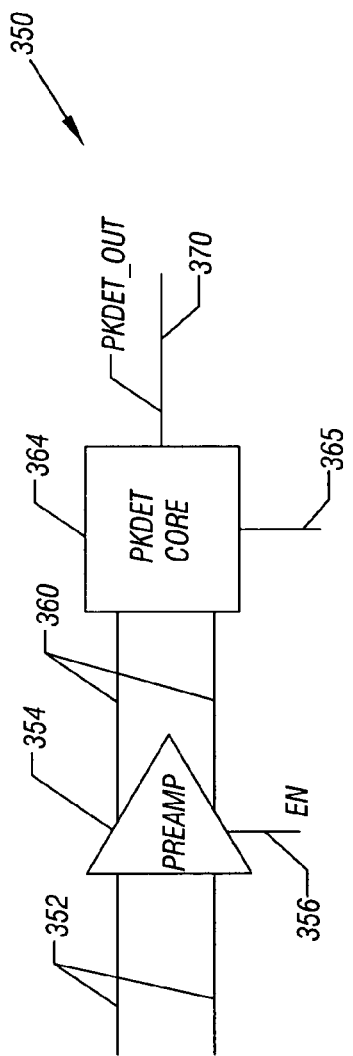
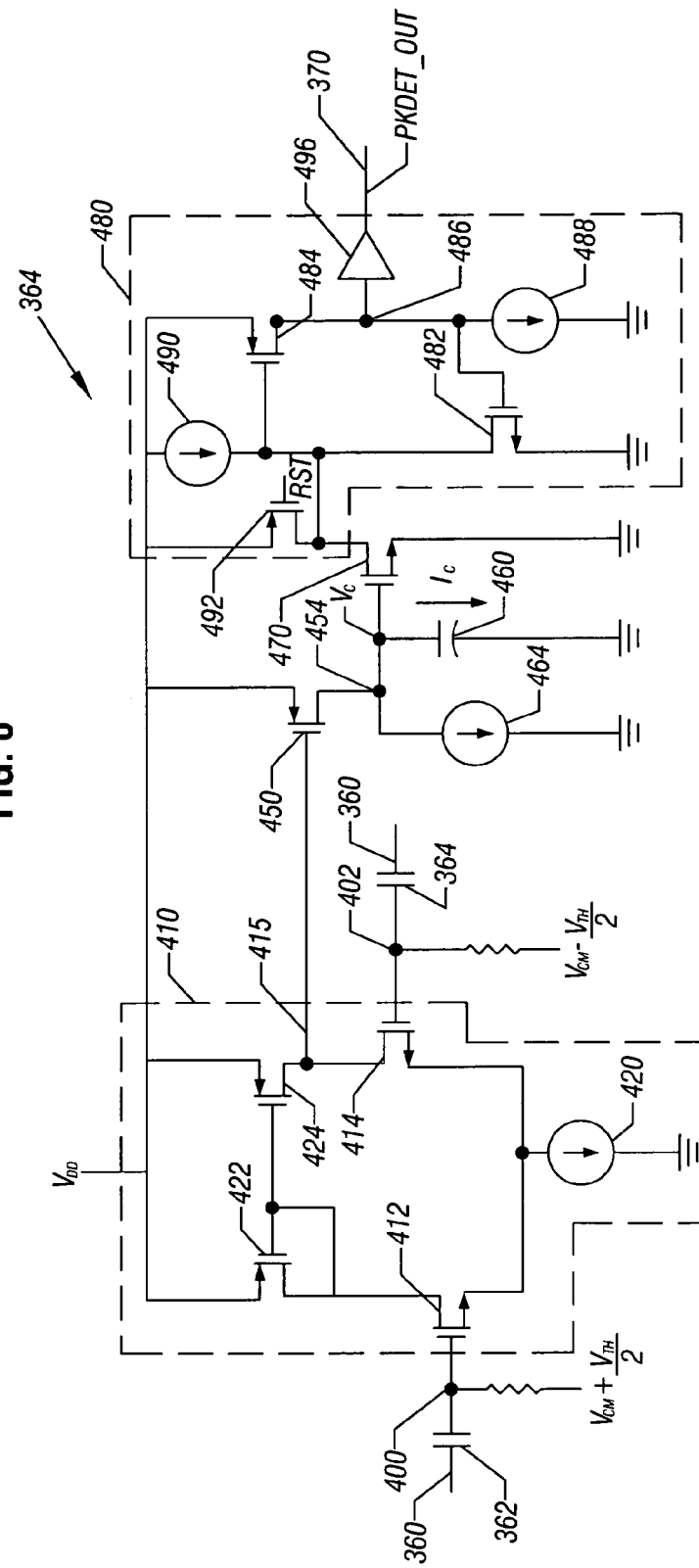
FIG. 8
FIG. 9

US 7,548,738 B2

PEAK DETECTOR

BACKGROUND

The invention generally relates to a peak detector.

A conventional radio frequency (RF) receiver includes various gain stages for purposes of receiving a relatively small magnitude RF signal and translating the received RF signal to an intermediate frequency (IF) signal or directly to a baseband (BB) signal in a direct-conversion receiver.

The RF signal that is received by the receiver typically varies in strength; and the receiver typically has a circuit called an automatic gain control (AGC) circuit for purposes of adjusting an internal gain of the receiver to accommodate the range of signal strengths. Thus, the AGC circuit causes the receiver to generally apply more gain to weaker signals and less gain to stronger signals. If insufficient gain is applied by the receiver, then the receiver may suffer from poor signal-to-noise (S/N) performance. If, however, the receiver applies too much gain to the received RF signal, then the circuitry of the receiver may become saturated and introduce significant non-linearities to the processed signal.

SUMMARY

In an embodiment of the invention, a receiver includes a gain stage, a peak detector and a processor. The gain stage provides an output signal, and the peak detector provides a binary indication of whether the output signal has reached a predetermined threshold. The processor controls the gain stage in response to the binary indication.

In another embodiment of the invention, a peak detector includes a capacitor, a circuit and a latch. The circuit stores charge on the capacitor in response to an input voltage exceeding a threshold voltage. The latch is coupled to the circuit to provide a binary indication of whether the input signal has reached a predetermined threshold.

Advantages and other features of the invention will become apparent from the following drawing, description and claims.

BRIEF DESCRIPTION OF THE DRAWING

FIG. 8 is a schematic diagram of a peak detector according to an embodiment of the invention.

FIG. 9 is a schematic diagram of a peak detector core of the peak detector of FIG. 8 according to an embodiment of the invention.

DETAILED DESCRIPTION

Figure 1:
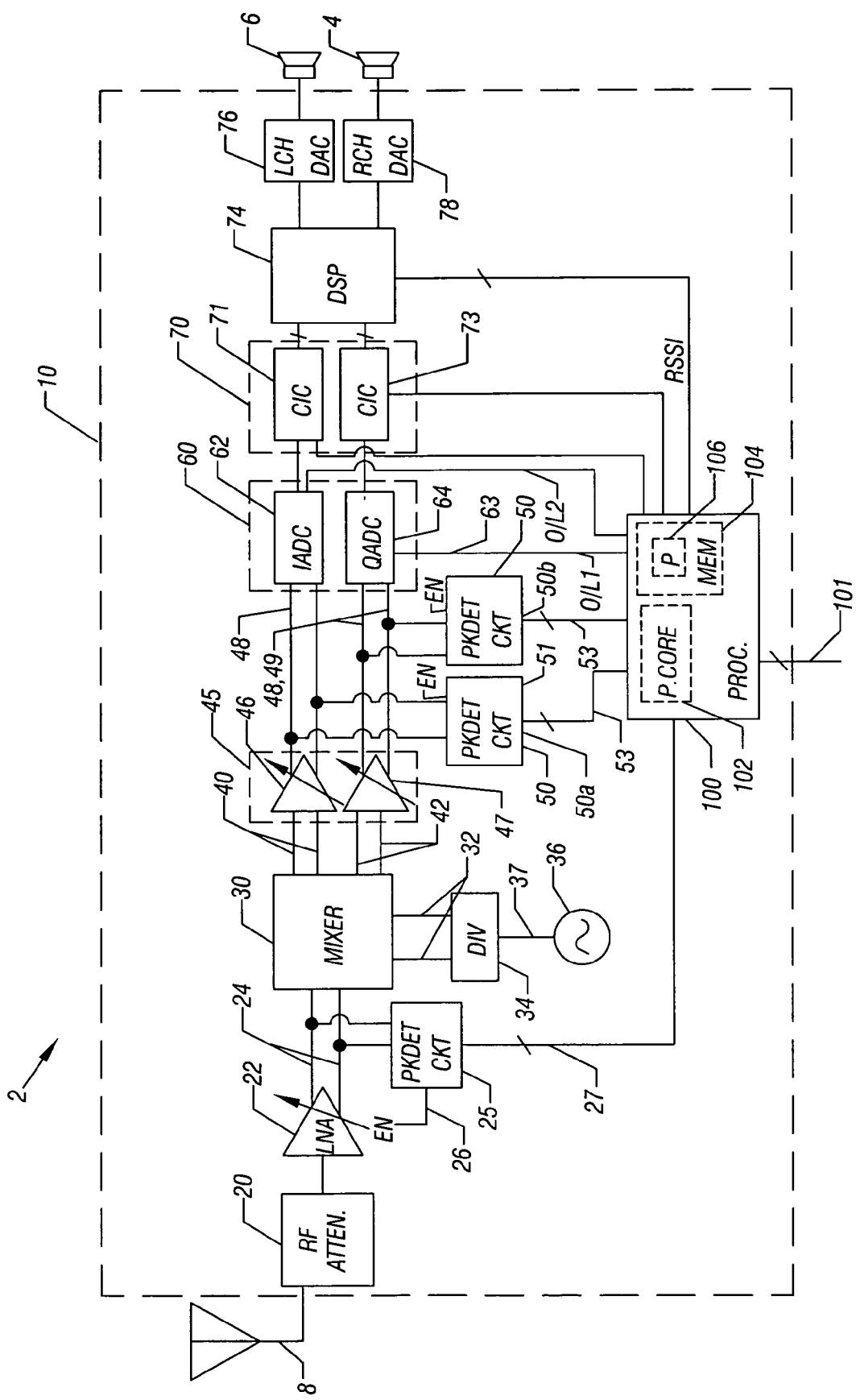
FIG. 1 is a schematic diagram of a wireless system according to an embodiment of the invention.

Referring to FIG. 1, in accordance with an embodiment of the invention, a wireless system 2 includes a radio frequency (RF) radio, or receiver 10, that is constructed to receive an RF signal from an antenna 8 and provide left and right channel analog audio signals to drive audio speakers 6 and 4, respectively. The wireless system 2 may be an FM radio system, in some embodiments of the invention. However, in accordance with the many different embodiments of the invention, the techniques, circuits and systems that are described herein may be applied to many different types of receiver systems, such as TV receiver systems, satellite radio receiver systems, Global Positioning Satellite (GPS) receiver systems, as just a few examples.

As described herein, the receiver 10 includes various gain stages. The gains of these gain stages are controlled by a digital processor 100 of the receiver 10. Unlike conventional receivers, the processor 100 is used to perform automatic gain control (AGC) for the receiver 10 instead of the AGC being provided by analog circuitry. The processor 100 includes a processing core 102 that executes instructions 106 (stored in a memory 104, for example) for purposes of sensing various gains and other parameters of the receiver 10 and controlling the gain stages of the receiver 10 accordingly. In some embodiments of the invention, the processor 100 may be a microcontroller, such as a microcontroller based on the 8051 instruction set. However, a processor other than a microcontroller as well as a different type of microcontroller may be used in other embodiments of the invention.

It is noted that in other embodiments of the invention, the digital processor 100 may be formed by hardwired digital logic. Thus, the digital processor 100 may be a microcontroller that executes firmware code (as an example) in some embodiments of the invention and hardwired digital logic in other embodiments of the invention. Therefore, in the context of this application, the phrase "processor" may apply to hardwired digital logic as well as a microcontroller or microprocessor.

In some embodiments of the invention, the processor 100 and components of the RF and IF processing chain (described further below) may be implemented on the same semiconductor die and thus, may be part of the same semiconductor package. In other embodiments of the invention, the processor 100 may be part of the same semiconductor package as the components of the RF/IF chain but located on a separate die. In other embodiments of the invention, the processor 100 and RF/IF chain components may be located in different semiconductor packages. Thus, many variations are possible and are within the scope of the appended claims.

Additionally, in accordance with some embodiments of the invention, the wireless system 2 may be a direct-conversion receiver that does not have IF stages. Thus, in accordance with these embodiments of the invention, the mixer 30 may furnish a baseband (BB) signal, instead of an IF signal.

Among the potential advantages of using the digital processor 100 (in lieu of analog circuitry, for example), analog implementations of an AGC may be highly non-linear, may require non-complimentary metal-oxide-semiconductor (CMOS) technology (e.g., bipolar transistors or diodes) and may have a relatively poorly-controlled gain. Furthermore, the gain control in analog circuitry may be affected by process variations; and the analog circuitry may consume a relatively significant amount of power. Additionally, unlike conventional AGC circuits, the AGC control that is provided by the processor 100 may not require external components (in some embodiments of the invention), in that the processor 100 may be integrated on the same semiconductor die as the other circuitry of the receiver 10. Additionally, due to its execution of program instructions 106, the AGC that is provided by the processor 100 may be readily changed by updating the program instructions 106 for the particular application in which the receiver 10 is to be used. Thus, for example, the receiver's AGC may be updated (by changing the program instructions 106) specifically for the manufacturer that uses the receiver 10 in a specific product. Also, analog AGC circuits may possibly degrade performance of the main block (e.g., the LNA), whose gain is being controlled.

FIG. 1 depicts an exemplary embodiment for the receiver 10, although many different embodiments are possible and are within the scope of the appended claims. As depicted in the embodiment shown in FIG. 1, the receiver 10 includes an RF attenuator 20 that receives an RF signal from the antenna 8 and provides an RF signal to a low noise amplifier (LNA) 22. The LNA 22 is one out of many possible gain stages of the receiver 10 that may be controlled pursuant to the AGC that is described herein.

The LNA 22 has a gain (an amplification or possibly an attenuation in the context of this application) that the LNA 22 applies to the received RF signal to produce an RF signal at differential output terminals 24 of the LNA 22. The differential output signal from the LNA 22, in turn, is received by a mixer 30 that translates the RF frequency of the received signal to an intermediate frequency (IF). The LNA 22 may have a single-ended output. Furthermore, the input to the LNA 22 may be single-ended or differential, depending on the particular embodiment of the invention. Thus, the mixer 30 forms the tuning component of the receiver 10 in that the mixer 30 translates the RF frequency to the desired IF channel. The receiver 10 may also include an IF bandpass filter (not depicted in FIG. 1). In some embodiments of the invention, modulation source input terminals 32 of the mixer 30 may receive a differential modulation signal from a frequency divider 34. The frequency divider 34 may, in turn, have an input terminal 37 that receives a reference frequency from a voltage controlled oscillator (VCO) 36, for example.

The mixer 30 produces two quadrature modulation analog signals (i.e., an I signal and a Q signal), one of which appears on a first set 40 of differential output terminals and the other of which appears on a second set 42 of differential output terminals. Programmable gain amplifiers (PGAs) 46 and 47 receive the quadrature signals from the mixer 30 and apply gains to these signals to produce corresponding differential output signals at output terminals 48 and 49 of the amplifiers 46 and 47, respectively. As described further below, in some embodiments of the invention, the AGC described herein may involve regulation of the gains of the amplifiers 46 and 47.

In accordance with some embodiments of the invention, analog-to-digital converters (ADCs) 60 of the receiver 10 convert the analog signals that are provided by the PGAs 46 and 47 into corresponding digital quadrature signals. Thus, in accordance with some embodiments of the invention, the ADCs 60 may include ADCs 62 and 64 that convert the output signals from the PGAs 46 and 47, respectively.

In accordance with some embodiments of the invention, the digital streams that are provided by the ADCs 62 and 64 are filtered by comb filters 71 and 73, respectively, before being provided to a digital signal processor (DSP) 74. The comb filters 71 and 73 may be replaced by other filters, in other embodiments of the invention.

Among its other features, in accordance with some embodiments of the invention, the DSP 74 demodulates the received IF signal into audio signals that are provided to left channel 76 and right channel 78 digital-to-analog converters (DACs), respectively. The left 76 and right 78 channel DACs produce audio signals to drive the speakers 6 and 4, respectively. Power amplifiers (not shown) may be coupled between the converters 70 and 78 and the speakers 4 and 6, in some embodiments of the invention.

In accordance with some embodiments of the invention, the digital processor 100 performs the AGC by gathering data from various sense points of the receiver 10. For example, in accordance with some embodiments of the invention, the receiver 10 includes a peak detector circuit 25 that is coupled to the differential output terminals 24 of the LNA 22. The peak detector 25, as its name implies, detects a peak magnitude of the signal that appears across the differential output terminals 24 for purposes of indicating (via an output signal line 27) to the processor 100 the magnitude of the output signal that is provided by the LNA 22. Thus, by determining the strength of the signal that is provided by the LNA 22, the processor 100 may control the gain of the LNA 22 accordingly. As described further below, the processor 100 may base its control of the LNA's gain based on other data gathered from other sense points of the receiver 10.

As another example of a gain stage control by the processor 100 in the AGC, in accordance with some embodiments of the invention, the processor 100 may use another peak detector circuit 50a of the receiver 10. The peak detector circuit 50a is coupled to the output terminals of the PGA 46 for purposes of detecting the strength of the signal that is produced by the PGA 46. Based on the strength of this signal as well as possible other data from other sense points, the processor 100 regulates the gain of the LNA 46 accordingly. It is noted that in some embodiments of the invention, the processor 100 may regulate the gains of both PGAs 46 and 47 together, and thus, may only use one peak detector circuit for purposes of detecting the strength of the signal that is produced by one of the PGAs 46 and 47. However, in other embodiments of the invention, the receiver 10 may include an additional peak detector circuit 50b (having a similar design 50 to the peak detector circuit 50b) for purposes of detecting the strength of the signal that is produced by the PGA 47. Therefore, in accordance with some embodiments of the invention, the processor 100 may regulate the gains of the PGAs 46 and 47.

In accordance with some embodiments of the invention, the processor 100 takes into account additional sense point data when performing the AGC. For example, in accordance with some embodiments of the invention, the processor 100 monitors overload bits that are provided by the ADCs 62 and 64. For example, as depicted in FIG. 1, in accordance with some embodiments of the invention, the ADC 62 provides (via an output line 65) an overload bit (called "O/L2," in FIG. 1); and the ADC 64 provides (via an output line 63) an overload bit (called "O/L1" in FIG. 1. The overload bit, as its name implies, indicates whether the associated ADC 62, 64 experiences an overload condition. The overload condition may be present when the input signal level of ADC 62, 64 is too high. Such an overload condition is characterized by low SNR (rising of the noise floor) at the output of ADC 62, 64. As a more specific example, in some embodiments of the invention, the ADC 62, 64 may be a delta-sigma converter, and an overload condition may also affect their stability when present. Both effects (low SNR and instability) may be undesired, and the AGC described herein regulates the gain of the stages 20, 22, 46 and 47 to limit the ADC input level. The overload condition may be detected as a repetition of the same ADC 62, 64 digital output for several consecutive clock cycles.

In some embodiments of the invention, the ADC 64 is a delta-sigma converter that provides a one bit output data stream; and by monitoring the one bit output data stream from the ADC 64, it is possible to detect an overload condition. The detection of the overload condition can also be performed in a DSP block, in accordance with some embodiments of the invention.

The overloading of the ADC 62, 64 may be temporary in nature due to signal fade; this is a condition that cannot be corrected by the AGC, which has inherently relatively long time constant. However, other conditions of the receiver 10 may cause the overloading of the ADC 62, 64. In particular, if the gains of the receiver 10 are too high, the ADC input signal level may also be too high and cause an overload condition. For purposes of avoiding this scenario, in accordance with some embodiments of the invention, when adjusting the gain of the LNA 22 or the PGAs 46 and 47, the processor 100 monitors the ADC overload bits for purposes of determining when overloading the ADC 62, 64 occurs. If overloading occurs after increasing a particular amplifier gain, then the processor 100 decreases the gain until the overload condition disappears.

As an example of another sense data point that may be considered by the processor 100 in its AGC when adjusting a gain is a received signal strength (RSSI) bit that is provided by the DSP 74. More specifically, during gain changes, in accordance with some embodiments of the invention, the processor 100 monitors the RSSI bit that is provided by an output terminal 73 of the DSP 74 (for example). The amount by which the RSSI changes may be indicative of intermodulation distortion showing up in-band. In general, the processor 100 monitors the RSSI bit to make sure that the changes that are reflected in the RSSI track the changes that occur to the gain being changed. For example, if the processor 100 changes the gain of the LNA 22 (as an example) by one decibel (dB), then the RSSI should also change by one dB. If not, then the processor 100, depending on the particular embodiment of the invention, may downwardly adjust the gain of the LNA 22 for purposes of eliminating or at least reducing the intermodulation distortion. The RSSI bit has meaning only in the case of the ADC not being in an overload condition. Therefore, the OL bits 63 and 65 are also monitored for purposes of detecting this overload condition.

In addition to changing the gains of the LNA 22 and the PGAs 46 and 47, the receiver 10 may have additional gain stages that may be controlled by the processor 100 in its AGC, depending on the particular embodiment of the invention. For example, in accordance with some embodiments of the invention, when performing the AGC, the processor 100 may regulate the gain of the RF attenuator 20, the gain of the comb filters 71 and 73 and may regulate the gain of the mixer 30.

Figure 2:
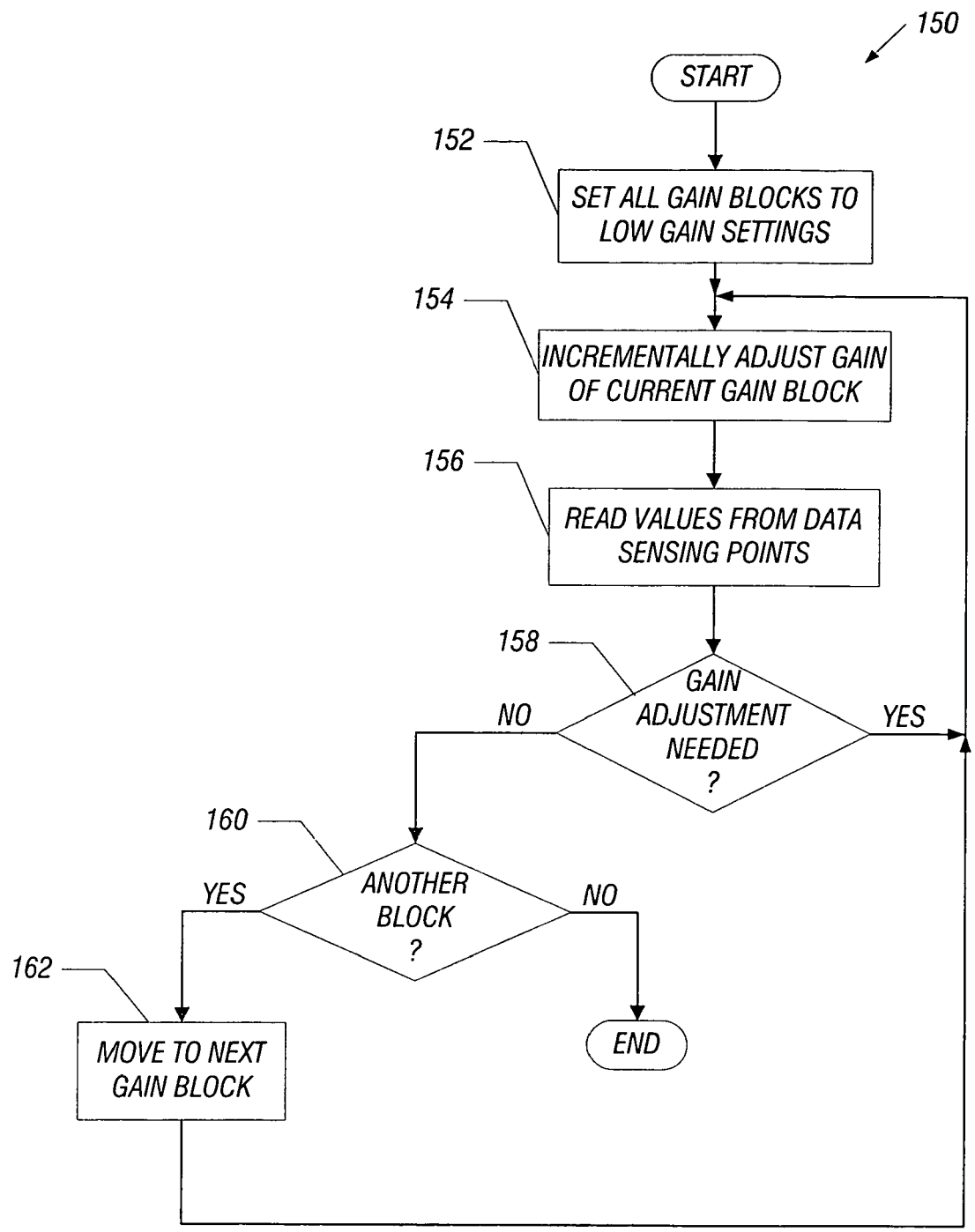
FIG. 2 is a flow diagram depicting a technique to automatically control various gains of a receiver of the system of FIG. 1 according to an embodiment of the invention.

Referring to FIG. 2, in accordance with some embodiments of the invention, the processor 100 performs a technique 150 for purposes of performing the AGC. Pursuant the technique 150, the processor 100 initially (at power up, for example) sets all of the gain blocks of the receiver 10 to predetermined low gain settings, pursuant to block 152. Next, the processor 100 begins a process to establish the appropriate gain for the stages, one stage at a time.

More specifically, in accordance with some embodiments of the invention, the processor 100 incrementally (block 154) adjusts the gain of the current gain block. For example, the processor 100 may begin at the source end of the receiver 10 by first adjusting the gain of the LNA 22 (as an example), in some embodiments of the invention. After incrementally adjusting the gain of the current gain block, the processor 100 then reads (block 156) values from the various data sense points of the receiver 10. These data values may include downstream data points as well as the strength of the signal that is produced by the current gain block being evaluated.

Based on these read values, the processor 100 determines (diamond 158) whether a gain adjustment is needed for the gain block, and if so, control returns to block 154. Otherwise, the gain has been adjusted for the current gain block, and the processor 100 determines (diamond 160) whether another gain block (such as the PGA 46, for example) is to be processed. If so, then the processor 100 moves (block 162) onto the next gain block (by adjusting the appropriate software parameters) and control transitions back to block 154. Otherwise, all of the gain blocks have been adjusted, and the processor 100 may intermittingly perform blocks 154 through 162 in subsequent adjustments of the AGC during the operation of the receiver 10. By adjusting (reducing, for example) in one block first, better noise and/or linearity performance may be achieved.

Figure 3:
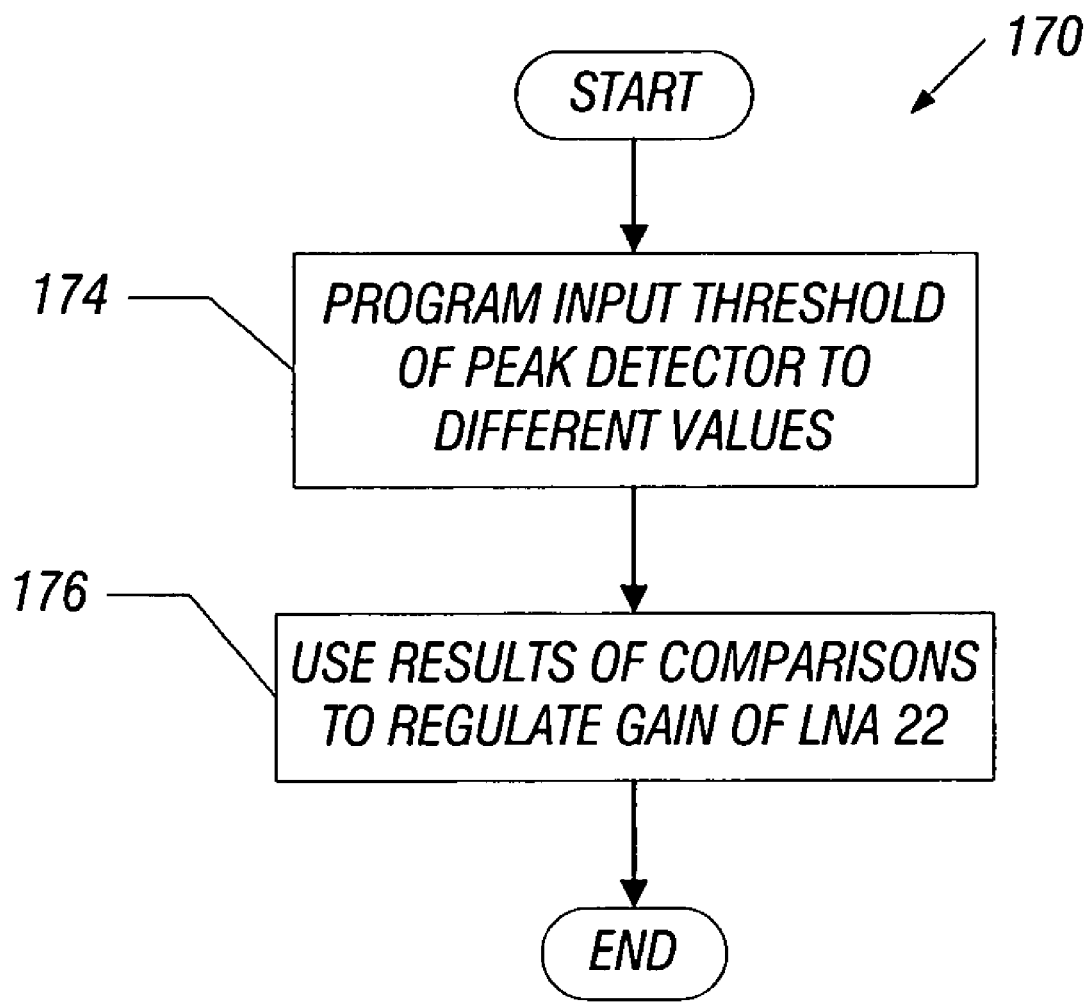
FIG. 3 is a flow diagram depicting a technique to adjust a gain of a low noise amplifier of the receiver according to an embodiment of the invention.

As a more specific example, FIG. 3 depicts a flow diagram 170 illustrating the processor's control of the gain of the LNA 22 when performing the AGC, in accordance with some embodiments of the invention. In accordance with some embodiments of the invention, the peak detector circuit 25 provides a binary output signal that is indicative of a comparison between the input signal to the peak detector circuit 25 and a programmable input threshold of the peak detector circuit 25. The processor 100 programs the input threshold to different values (block 174) to cause the peak detector circuit 25 to compare its input signal to different thresholds; and the processor uses (block 176) the results of these comparisons to regulate the gain of the LNA 22.

As a more specific example, in accordance with some embodiments of the invention, the processor 100 programs the input threshold of the peak detector circuit 25 with at two different thresholds: an upper threshold and a lower threshold. Each threshold produces a binary output from the peak detector circuit 25. Depending on the binary output for these two comparisons, the processor 100 determines if the input signal to the peak detector circuit 25 needs to be made larger or smaller and regulates the gain of the LNA 22 accordingly. Thus, from the two comparisons, the processor 100 may determine whether the input signal is above the upper threshold, between the upper and lower thresholds or below the lower threshold. The above-described use of two thresholds is for purposes of example, in that the processor may program the input threshold of the peak detector circuit 25 with more than two thresholds and regulate the gain of the LNA 22 in accordance with the observed output signals from the peak detector circuit 25 in other embodiments of the invention.

Figure 4:
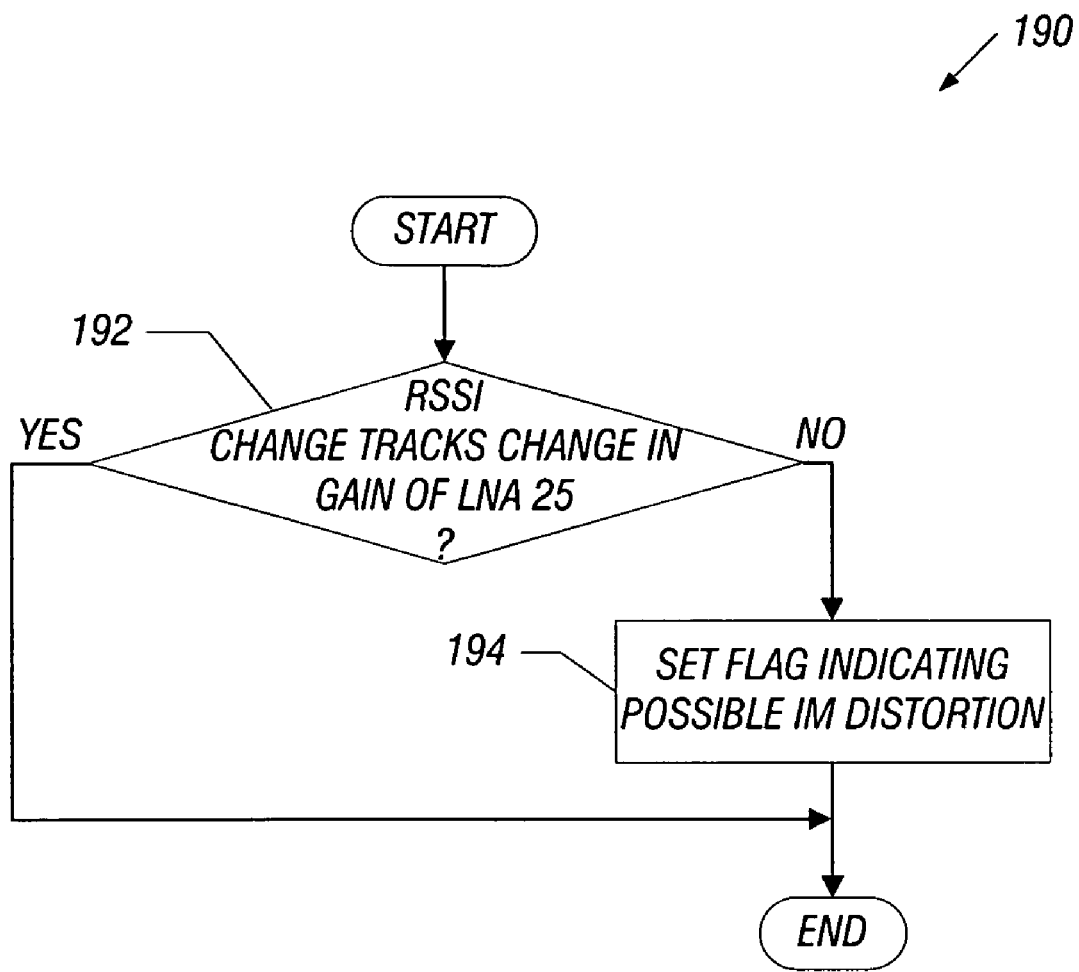
FIG. 4 is a flow diagram depicting a technique to detect intermodulation distortion in the receiver according to an embodiment of the invention.

As a more specific example of determining whether sensed data other than the differential output signal of the LNA 22 is acceptable, the processor 100 may perform at least the following technique 190 (see FIG. 4) during the adjustment of the gain for the LNA 22. Pursuant to the technique 190, the processor 100 determines (diamond 192) whether the change in the RSSI bit tracks the change in the gain of the LNA 25. If not, then the processor 100 sets (block 194) a flag indicating possible intermodulation distortion. Thus, in response to this flag being set, the processor 100 may, for example, downwardly adjust the gain of the LNA 22 as well as take other corrective action, in accordance with the particular embodiment of the invention.

Figure 5:
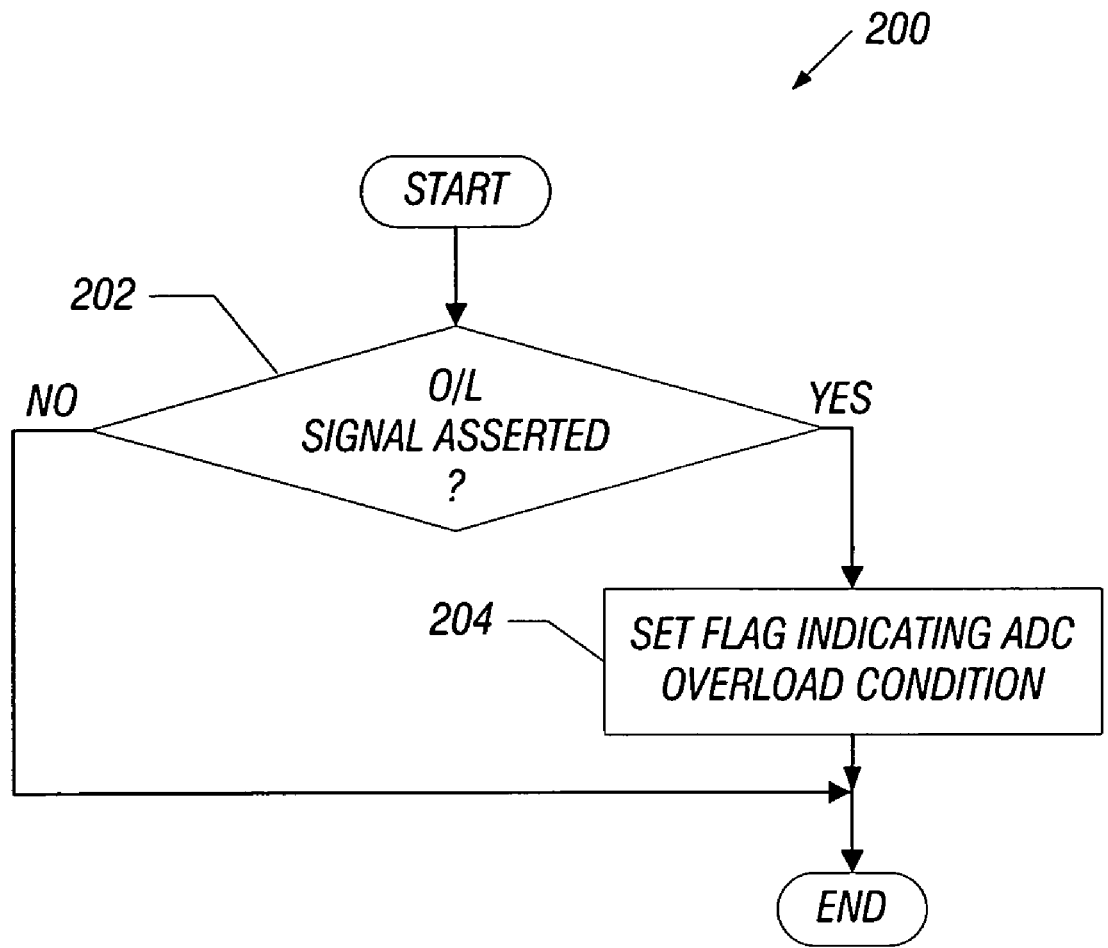
FIG. 5 is a flow diagram depicting a technique to set the gain of the low noise amplifier of the receiver based at least in part on an overload condition of an analog-to-digital converter according to an embodiment of the invention.

As another example of a sensed data value other than the strengths of the differential output signal of the LNA 22, the processor 100 may perform a technique 200 (depicted in FIG. 5) for purposes of monitoring the overload bit from the ADC 62, 64. Pursuant to the technique 200, the processor 100 determines (diamond 202) whether the overload bit has been asserted, and if so, the processor 100 sets (block 204) a flag indicating the ADC overload condition. Based on this flag, the processor 100 may downwardly adjust the gain of the LNA 22 as well as take other and/or corrective measures (lowering the PGA gain, for example), depending on the particular embodiment of the invention.

Figure 6:
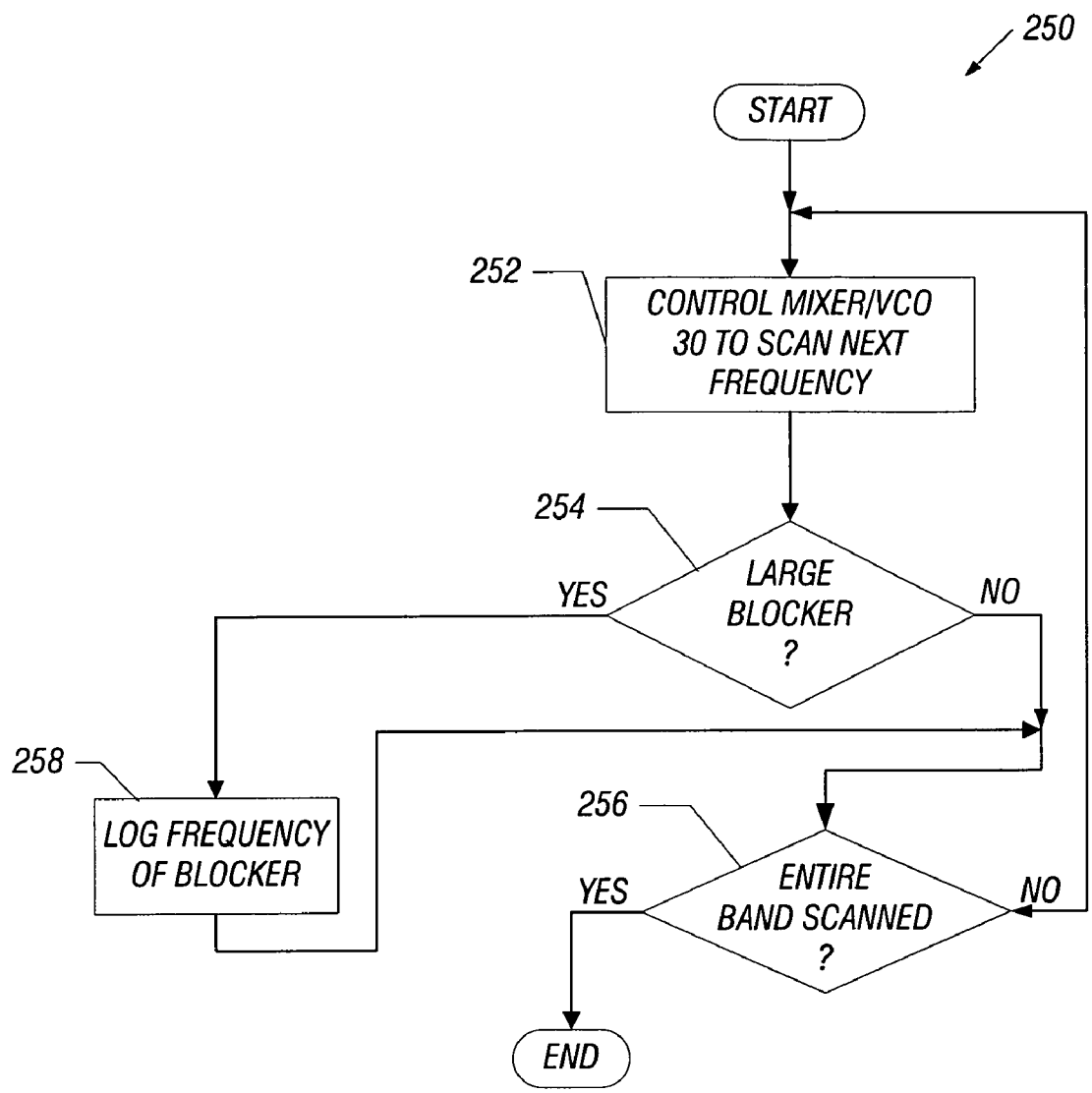
FIG. 6 is a flow diagram depicting a technique to scan the entire frequency band to log frequencies of blockers according to an embodiment of the invention.

Referring to FIG. 6, in accordance with some embodiments of the invention, the processor 100 performs a technique 250 at the power-up of the receiver 10. Pursuant to the technique 250, the processor 100 controls (block 252) the mixer 30 or the VCO 36 to select the next frequency of a scan of the entire band. The processor 100 monitors (via the peak detector circuit 50, for example) the output of the mixer 30 for purposes of determining (diamond 254) whether a large blocker is present at the tuned frequency. The front end of the peak detector circuit 25 is wideband and thus, may not provide helpful information. However, either the output signal of the peak detector circuit 50 or the RSSI bit (conditional on the O/L bit) may be used to indicate the presence of a big blocker around the tuned frequency or at the tuned frequency channel, respectively.

A large blocker is generally a signal that is out-of-band with respect to the potentially tuned-in channels but affects the detected signal strength and thus, may affect the overall AGC by the processor 100. Thus, in response to detecting a large blocker, the processor 100 logs (block 258) the frequency of the blocker.

If, pursuant to the technique 250 the processor 100 determines (diamond 256) that the entire band has not been scanned, then control returns to 252. Otherwise, the technique 250 ends. Therefore, the result of the technique 250 is a log of the frequencies of which blockers exist. Using the blocker frequency log, the processor 100 in the AGC may generally apply more gain when the mixer 30 tunes to a frequency away from a recorded blocker frequency than when the mixer 30 tunes to a frequency near a previously-recorded blocker frequency. Thus, by using this log, potential intermodulation blockers are identified, while allowing higher gains for other stations.

There may be other blockers present outside the FM band, which do not show up in the scan. These "out-of-band" blockers are unlikely, however, to impact any of the downstream blocks like the PGAs 46 and 47 or the ADCs 62 and 64. However, the LNA 22 and the mixer 30 still sees these large blockers. The AGC algorithm uses the front-end wideband peak detector circuit 25 to gauge these blocker levels and reduce the front-end gain appropriately.

Alternatively, in accordance with some embodiments of the invention, the processor 100 controls the AGC to not let the AGC turn down the gain too much in the presence of larger blockers. This achieves the same result but without the above-described pre-scanning, the receiver 10 may potentially receive an intermodulated signal in the tuned channel.

Figure 7:
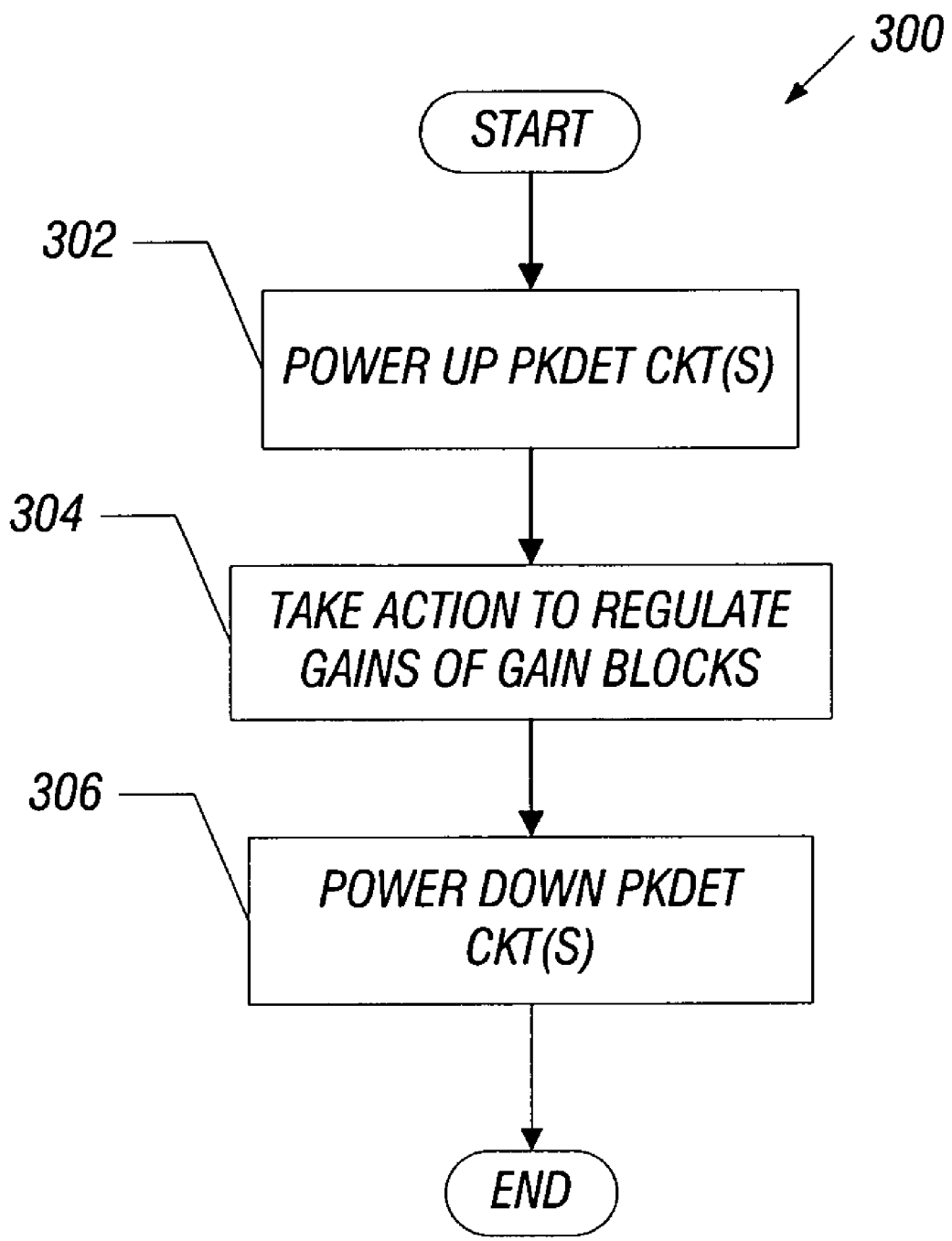
FIG. 7 is a flow diagram depicting a power conservation technique according to an embodiment of the invention.

Referring to FIG. 7, due to the above-described digital AGC, the receiver 10 may use a power conservation technique 300 in accordance with some embodiments of the invention. Pursuant to the technique 300, the processor 100 powers up (block 302) the peak detector circuit(s) of the receiver 10 for purposes of time periods in which the processor 100 evaluates and possibly modifies the gains of the gain stages of the receiver 10. In accordance with some embodiments of the invention, the processor 100 periodically powers up and down the peak detector circuit(s). It is possible that the powering up and down of the peak detector circuit(s) may introduce noise into the RF signal path. However, as further described below, the peak detector circuit may only be partially powered down, in accordance with some embodiments of the invention. Thus, after powering up the peak detector circuit(s), the processor 100 takes action to regulate the gains of the gain blocks, pursuant to block 304. Subsequent to the regulation of the gains, in accordance with some embodiments of the invention, the processor 100 partially powers down the peak detector circuit(s), pursuant to block 306.

FIG. 8 depicts a peak detector circuit 350 in accordance with some embodiments of the invention. The peak detector circuit 350 includes a preamplifier 354 and a peak detector core 364. The preamplifier 354 includes input terminals 352 that may be coupled to the particular signal being monitored. For example, in accordance with some embodiments of the invention, the peak detector circuit 25 (FIG. 1) for the LNA 22 may have its input terminals 352 coupled to the output terminals 24 of the LNA 22. In accordance with some embodiments of the invention, the preamplifier 356 has a power enable terminal 356 that, when asserted, powers down the preamplifier 354. Therefore, in accordance with some embodiments of the invention, when not regulating the gains pursuant to the AGC, the processor 100 may assert the signal present at the terminal 356 for purposes of powering down the peak detector core 364 to conserve power in the receiver but keep the preamplifier 354 powered up to isolate the main receive signal path from this disturbance (i.e., the peak detect block is powered down to save power). If the preamplifier 354 and the peak detector core 364 is considered to be a functional block, then by varying the amount of this block (from the sub-block/circuit that is farthest away from the preamplifier input) that is shut down, a tradeoff could be achieved between the distortion introduced by the powering up and down of the peak circuit and the amount of the blocks shut down The peak detector core 364 includes input terminals 360 that are coupled to corresponding differential output terminals of the preamplifier 354. The peak detector core 364 determines when the signal that is provided by the preamplifier 354 reaches a predetermined, programmable (programmable by the processor 100 via control lines 365, for example) threshold voltage level. When the signal that is provided by the preamplifier 354 reaches this level, the peak detector core 364 asserts a binary signal (called "PKDET_OUT" in FIG. 8) at its output terminal 370. The preamplifier may have variable gain settings, which in conjunction with the different input threshold settings (of the peak detector circuit) can support a very wide dynamic range of input signals whose peak needs to be detected.

Referring to FIG. 9, in accordance with some embodiments of the invention, the peak detector core 364 includes a differential amplifier 410 that receives a differential input signal at its input terminals 360. More specifically, in accordance with some embodiments of the invention, the differential amplifier 410 includes input nodes 400 and 402 that receive bias voltages that offset from each by a threshold voltage (called $V_{TH}$"). Due to the nature of the differential amplifier 410, the amplifier 410 cancels out the common mode voltage (called "$V_{CM}$" in FIG. 9) so that the amplifier 410 turns on a transistor 450 to store charge on a capacitor 460 when the difference signal between the input terminals 360 exceeds the target peak threshold $V_{TH}$. The capacitor 460 has a terminal voltage (called "$V_C$" in FIG. 9) and receives a charging current (called "$I_C$" in FIG. 9), which are further described below in connection with FIGS. 11 and 12.

The capacitor 460 is coupled between a node 454 and ground. The transistor 450 may be, for example, a p-channel metal-oxide-semiconductor field-effect-transistor (PMOSFET) that has its source-to-drain path coupled between a positive supply voltage (called "$V_{DD}$" in FIG. 9) and the node 454. The gate terminal of the PMOSFET 450, in turn, is coupled to a single-ended output terminal 415 of the differential amplifier 410. Thus, when the differential amplifier 410 amplifies a signal that is near and exceeds the $V_{TH}$ threshold voltage, the PMOSFET 450 turns on to couple the $V_{DD}$ supply voltage to the node 454 and thus, store charge on the capacitor 460.

An advantage of the peak detect topology that is described herein is that the differential nature of the signal (whose peak is being detected) is preserved while being gained/compared to the threshold in a fairly simple manner at the input of the peak detect core. A separate differencing amplifier may not be needed to either compare this signal to the threshold or to measure the common mode. This topology avoids the need for either a differential to single-ended converter or to ignore one half of the signal (a 6 dB loss) and also to take care of the common mode somehow.

Figure 10:
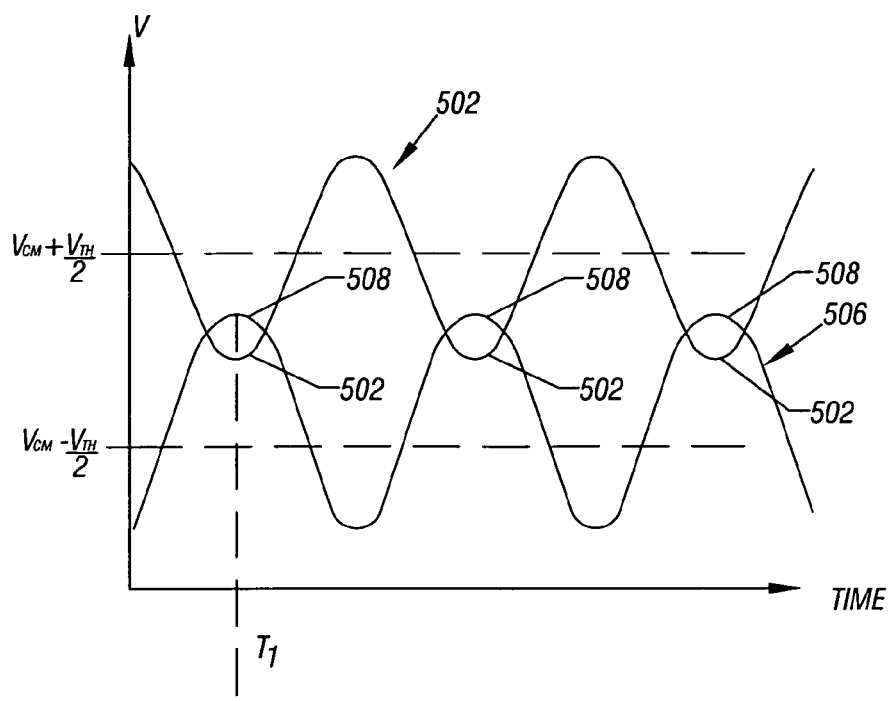
FIG. 10 illustrates input voltage waveforms for a differential amplifier of the peak detector core of FIG. 9 according to an embodiment of the invention.
Figure 11:
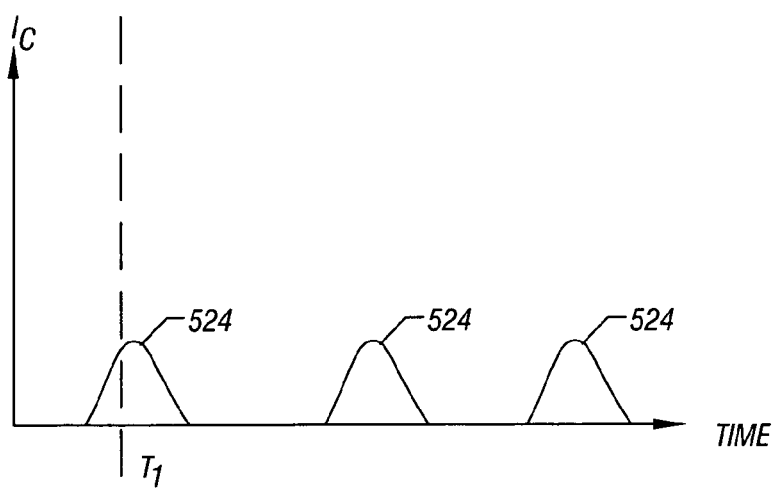
FIG. 11 illustrates a current of a capacitor of the peak detector circuit according to an embodiment of the invention.

As a more specific example, FIG. 10 depicts an exemplary voltage waveform 502 may be received at the node 400 (see FIG. 9) and an exemplary voltage waveform 506 may be received at the node 402 (see FIG. 9). Thus, the difference between the waveforms 502 and 506 forms a difference signal that is amplified by the differential amplifier 410 (see FIG. 9). FIG. 11 depicts the $I_C$ charging current of the capacitor 460 that results from the waveforms 502 and 506; and FIG. 12 depicts the $V_C$ voltage of the capacitor 460.

Figure 12:
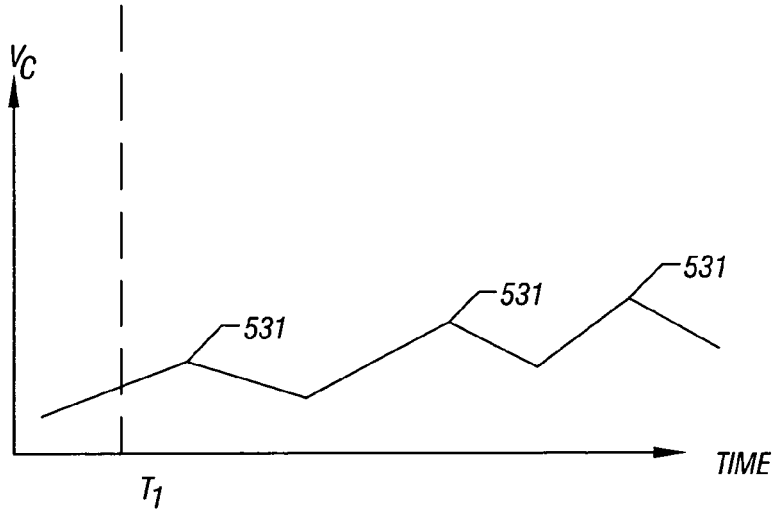
FIG. 12 is a waveform depicting a voltage of a capacitor of the peak detector circuit according to an embodiment of the invention.

Referring to FIGS. 10, 11 and 12 in conjunction with FIG. 9, near time $T_1$, the difference signal to the differential amplifier 410 is equal to the $V_{TH}$ threshold voltage to cause the differential amplifier 410 to turn on the transistor 450 to store charge in the capacitor 460. More specifically, near time $T_1$, the $I_C$ charging current pulses high (as indicated at reference numeral 524 in FIG. 11) to store an incremental charge on the capacitor 460.

Over time, the $V_C$ capacitor voltage rises to form peaks 531. Thus, the peaks 531 produced by the turning on of the PMOSFET 450 are averaged at the node 454. For purposes of preventing the charge on the capacitor 460 from remaining the same even if another peak is not detected, the peak detector core 364 includes a bleed current source 464 that is coupled between the node 454 and ground for purposes of establishing a slight bleed current from the capacitor 460. Thus, as depicted in FIG. 12, between the peaks 532, the voltage of the capacitor 460 linearly decreases.

Assuming a sustained input signal magnitude that will eventually cause the PKDET_OUT to be asserted, after a certain number (10 to 100 cycles, as example) of cycles, the $V_C$ voltage builds to activate an n-channel MOSFET (NMOSFET) 470. The MOSFET 470 is coupled to a latch 480 of the peak detector core 364. In its initial state, the latch 480 stores a value (indicated at an output node 486 of the latch 480) that is indicative of a binary zero state (as an example). However, upon activation of the NMOSFET 470, the latch 480 transitions to a state in which the output node 486 indicates a binary one state. An output buffer 496 is coupled to the node 486 for purposes of providing the PKDET_OUT signal to the output terminal 370. Thus, to summarize, upon activation of the NMOSFET 470, the latch 480 changes states to assert the PKDET_OUT signal to indicate detection of the peak magnitude.

After the assertion of the PKDET_OUT signal, in accordance with some embodiments of the invention, the processor 100 may control a PMOSFET 492 for purposes of resetting the latch 480. In this manner, in some embodiments of the invention, the PMOSFET 492 has its source-to-drain path coupled between the $V_{DD}$ supply voltage and the drain terminal of the NMOSFET 470.

Among the other features of the peak detector core 364, in accordance with some embodiments of the invention, the differential amplifier 410 may include, for example, a matched pair of NMOSFETs 412 and 414 that have their source terminals coupled in common to a current source 420. The current source 420 establishes a bias current through the NMOSFETs 412 and 414 and thus, ideally establishes equal bias currents through both halves of the differential amplifiers 410 when the signals at the input 360 terminals are balanced. The drain terminal of the NMOSFET 412 may be coupled to, for example, the drain terminal of a PMOSFET 422; and the drain terminal of the NMOSFET 414 may be coupled to the drain terminal of a PMOSFET 424. The drain terminal of the NMOSFET 414, in turn, forms the single-ended output terminal 415 of the differential amplifier 410, in some embodiments of the invention. The drain terminal of the PMOSFET 422 may be coupled to the gate terminal of the PMOSFET 422; and the source terminals of the PMOSFETs 422 and 424 may be coupled to the $V_{DD}$ supply voltage.

In accordance with some embodiments of the invention, the latch 480 may include, for example, an NMOSFET 482 and a PMOSFET 484. The drain-to-source path of the NMOSFET 482 is coupled between an input terminal of the latch 480 and ground. The input terminal of the latch 480, in turn, is coupled to the drain terminals of the NMOSFET 470 and the PMOSFET 492, in some embodiments of the invention.

A current source 490 may be coupled between the $V_{DD}$ supply voltage and the input voltage of the latch 480, in some embodiments of the invention. Furthermore, a current source 488 may be coupled between the output node 486 and ground to establish a flow from the output node 486 to ground, in some embodiments of the invention. The current sources 488 and 490 ensure that the latch 480 does not falsely trigger when the NMOSFET 470 is not on, and the current sources 488 and 490 help in setting the latch threshold to be slightly above the CMOS $V_T$ of the NMOSFET 470. The gate terminals of the NMOSFET 482 and the PMOSFET 484 are coupled to the output 486 and input nodes of the latch 480, respectively, in some embodiments of the invention.

It is noted that the structure of the latch 480 is depicted in FIG. 9 and described above for purposes of illustrating one out of many possible embodiments of the invention. Thus, many other embodiments of the latch 480 are possible and are within the scope of the appended claims.

FIG. 9 depicts an exemplary embodiment of the peak detector core in accordance with a particular embodiment of the invention. However, it is understood that other embodiments are possible and are within the scope of the appended claims. For example, in accordance with another embodiment of the invention, the node 402 (instead of the output terminal 415) may be coupled to the gate terminal of the PMOSFET 450. Thus, many variations are possible and are within the scope of the appended claims.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A receiver comprising:
   a gain stage to provide an output signal;
   a peak detector to provide a binary indication of whether the output signal has reached a predetermined threshold, the peak detector comprising an amplifier to provide an output signal, a capacitor and a circuit comprising a switch to couple the amplifier to the capacitor to store charge in the capacitor in response to the output signal exceeding a threshold voltage;
   a processor to control the gain stage in response to the binary indication; and
   a latch to provide the binary indication, the latch being activated by the circuit in response to a voltage of the capacitor surpassing a second threshold.

2. The receiver of claim 1, wherein the gain stage comprises an amplifier to receive a radio frequency signal.

3. The receiver of claim 1, wherein the gain stage comprises an amplifier to receive an intermediate frequency signal.

4. The receiver of claim 1, wherein the processor is adapted to at least partially power down the peak detector intermittingly.

5. The receiver of claim 4, wherein the amplifier receives a signal from a radio frequency path of the receiver, and the processor powers down the peak detector independently from a power state of the amplifier.

6. The receiver of claim 1, further comprising:
   a bleed current source to establish a bleed current to remove charge from the capacitor.

7. The receiver of claim 1, wherein the amplifier comprises:
   a differential amplifier comprising an output terminal coupled to the circuit adapted to remove an input bias from the output terminal.

8. The receiver of claim 1, wherein the switch comprises a transistor.

9. The receiver of claim 1, wherein the peak detector further comprises:
   a preamplifier adapted to be selectively disabled to isolate the peak detector from the gain stage.

10. A peak detector comprising:
    a capacitor;
    a circuit comprising a switch to couple an input signal to the capacitor to store charge on the capacitor in response to the input signal exceeding a threshold;
    a latch coupled to the circuit to provide a binary indication of whether the input signal has reached a predetermined threshold, the latch being adapted to be activated in response to a voltage of the capacitor exceeding a second threshold; and
    a differential amplifier comprising an output terminal coupled to the circuit, the differential amplifier adapted to remove an input bias from the output terminal.

11. The peak detector of claim 10, wherein the voltage of the capacitor increases in response to the circuit storing charge on the capacitor, and the latch transitions states in response to the voltage of the capacitor exceeding a predetermined threshold voltage.

12. The peak detector of claim 10, further comprising:
    a bleed current source to establish a bleed current remove charge from the capacitor.

13. The peak detector of claim 10, further comprising:
    a preamplifier adapted to be selectively disabled to isolate the peak detector from the gain stage.

14. A method comprising:
    coupling a peak detector to an output signal of a gain stage of a receiver;
    using the peak detector to provide a binary indication of whether the output signal has reached a predetermined threshold;
    using a processor to control the gain stage in response to the binary indication;
    storing charge on a capacitor of the peak detector in response to the output signal exceeding a first threshold, the storing comprising coupling the capacitor to the output signal; and
    changing a state of a latch of the peak detector to provide the binary indication in response to a voltage of the capacitor surpassing a second threshold.

15. The method of claim 14, further comprising:
    using to gain stage to amplify a radio frequency signal to produce the output signal.

16. The method of claim 14, further comprising:
    interrmittingly at least partially powering down the peak detector while keeping the gain stage powered up.

17. The method of claim 14, further comprising:
    establishing a bleed current from the capacitor.

* * * * *